United States Patent
Fornage

(10) Patent No.: US 9,557,367 B2
(45) Date of Patent: Jan. 31, 2017

(54) METHOD AND APPARATUS FOR MONITORING MAXIMUM POWER POINT TRACKING

(71) Applicant: Enphase Energy, Inc., Petaluma, CA (US)

(72) Inventor: Martin Fornage, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 252 days.

(21) Appl. No.: 14/459,363

(22) Filed: Aug. 14, 2014

(65) Prior Publication Data
US 2015/0048854 A1    Feb. 19, 2015

Related U.S. Application Data

(60) Provisional application No. 61/865,793, filed on Aug. 14, 2013.

(51) Int. Cl.
*H02J 3/12* (2006.01)
*G05F 1/00* (2006.01)
(Continued)

(52) U.S. Cl.
CPC .......... *G01R 31/2605* (2013.01); *H02S 40/32* (2014.12); *H02S 50/00* (2013.01); *H02S 50/10* (2014.12); *G01R 31/40* (2013.01)

(58) Field of Classification Search
CPC .............. G05F 1/463; G05F 1/66; G05F 1/67; H02M 2001/0009; H02M 2001/0012
(Continued)

(56) References Cited

U.S. PATENT DOCUMENTS

| 7,925,459 B2 | 4/2011 | Fornage |
| 8,359,176 B2 | 1/2013 | Fornage |

(Continued)

FOREIGN PATENT DOCUMENTS

WO    WO-2012119257 A1    9/2012

OTHER PUBLICATIONS

Hohm et al., "Comparative Study of Maximum Power Point Tracking Algorithms", Progress in Photovoltaics: Research and Applications 2003, vol. 11, pp. 47-62, Nov. 22, 2002.
(Continued)

*Primary Examiner* — Adolf Berhane
*Assistant Examiner* — Gary Nash
(74) *Attorney, Agent, or Firm* — Moser Taboada

(57) ABSTRACT

A method and apparatus for monitoring maximum power point tracking (MPPT) by measuring, external to a device that performs the MPPT, a DC current and a DC voltage to obtain a DC current value and a DC voltage value, wherein the DC current and the DC voltage are from a distributed generator (DG) coupled to the device. The method determining, external to the device, a constellation of data points, wherein each data point of the constellation comprises a DC voltage change and a corresponding DC current change resulting from an AC waveform, and determining, a dynamic resistance of the DG based on the constellation. The method computes a ratio of the DC voltage value to the DC current value, compares the dynamic resistance to the ratio, and determines, based on the comparison of the dynamic resistance to the ratio, if the DG is biased at a maximum power point (MPP).

20 Claims, 7 Drawing Sheets

(51) Int. Cl.
*G01R 31/26* (2014.01)
*H02S 50/10* (2014.01)
*H02S 40/32* (2014.01)
*G01R 31/40* (2014.01)

(58) Field of Classification Search
USPC ............... 323/241, 246, 283, 285, 290, 906
See application file for complete search history.

(56) References Cited

U.S. PATENT DOCUMENTS

| | | | | |
|---|---|---|---|---|
| 2007/0221267 A1* | 9/2007 | Fornage | ............... | H02M 3/285 |
| | | | | 136/244 |
| 2009/0080226 A1* | 3/2009 | Fornage | ................... | G05F 1/67 |
| | | | | 363/74 |
| 2010/0091532 A1* | 4/2010 | Fornage | ................... | G05F 1/67 |
| | | | | 363/95 |
| 2010/0106438 A1* | 4/2010 | Fornage | ................... | G05F 1/67 |
| | | | | 702/64 |
| 2010/0191489 A1 | 7/2010 | Zolot | | |
| 2011/0140680 A1* | 6/2011 | Heo | ......................... | G05F 1/67 |
| | | | | 323/304 |
| 2013/0114302 A1 | 5/2013 | Escobar et al. | | |

OTHER PUBLICATIONS

"Guide to Interpreting I-V Curve Measurements of PV Arrays", Solmetric Corporation, pp. 1-23, Mar. 1, 2011.
PCT Search Report and Written Opinion, PCT/US2014/051014, 9 pages, Date of mailing Nov. 7, 2014.

\* cited by examiner

METHOD AND APPARATUS FOR MONITORING MAXIMUM POWER POINT TRACKING

CROSS-REFERENCE TO RELATED APPLICATION

This application claims priority to U.S. Provisional Patent Application No. 61/865,793 filed on Aug. 14, 2013, which is incorporated by reference herein in its entirety.

BACKGROUND

Field of the Invention

Embodiments of the present invention generally relate to distributed power systems and, more particularly, to a method and apparatus for monitoring maximum power point tracking.

Description of the Related Art

Distributed power systems typically comprise a power source that generates direct current (DC) power, a power converter, and a controller. The power source may be a distributed generator such as a photovoltaic (PV) module, a wind turbine, a hydroelectric generator, fuel cell, and the like. The power converter may convert the DC power into alternating current (AC) power, which may be coupled directly to the AC power grid.

One indicator of the efficiency at which the distributed generator is operating is represented in a graph of current versus voltage also referred to as an I-V curve or I-V characteristic. The point on the curve associated with the voltage and current values that result in maximum power is known as the maximum power point (MPP). To ensure that the distributed generator is running at peak efficiency, a technique is used to maintain the distributed generator at this maximum power point, i.e., a maximum power point tracking (MPPT) function implemented by a coupled power converter. Ideally, the MPPT function ensures a maximum power from the distributed generator as power output may vary, for example as a result from degradation or shading of a PV module. The MPPT function varies internal electronic controls of the power converter to drive the distributed generator to its MPP. Since the MPP shifts with external factors (PV panel degradation, shading, and the like), it is important that MPPT operates efficiently to maintain the distributed generator at its MPP.

Therefore, there is a need in the art for monitoring the MPPT performance of a device performing MPPT.

SUMMARY

A method and apparatus for monitoring performance of maximum power point tracking (MPPT) substantially as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention are directed to a method and apparatus that monitors the maximum power point tracking (MPPT) performance of a device performing MPPT, such as a power converter that is coupled to a distributed generator (DG). The performance apparatus injects an AC stimulus between the DG and the power converter and determines from the corresponding response (i.e., change in output from the DG), the efficiency of the MPPT function of the power converter. In other words, the efficiency of the combination is monitored without direct interface with the controller of the power converter by analyzing the resultant MPPT compensation.

In some embodiments, the performance monitoring apparatus is deployed to a generation site (e.g., residential or commercial site) and the monitored results are communicated to a gateway using network communication protocols or power line communications (PLC). In some embodiments the performance monitoring apparatus triggers a warning notification to the user (e.g., the owner of the residential site) when the DG and power converter combination is not operating at the most efficient power point.

Figure 1:
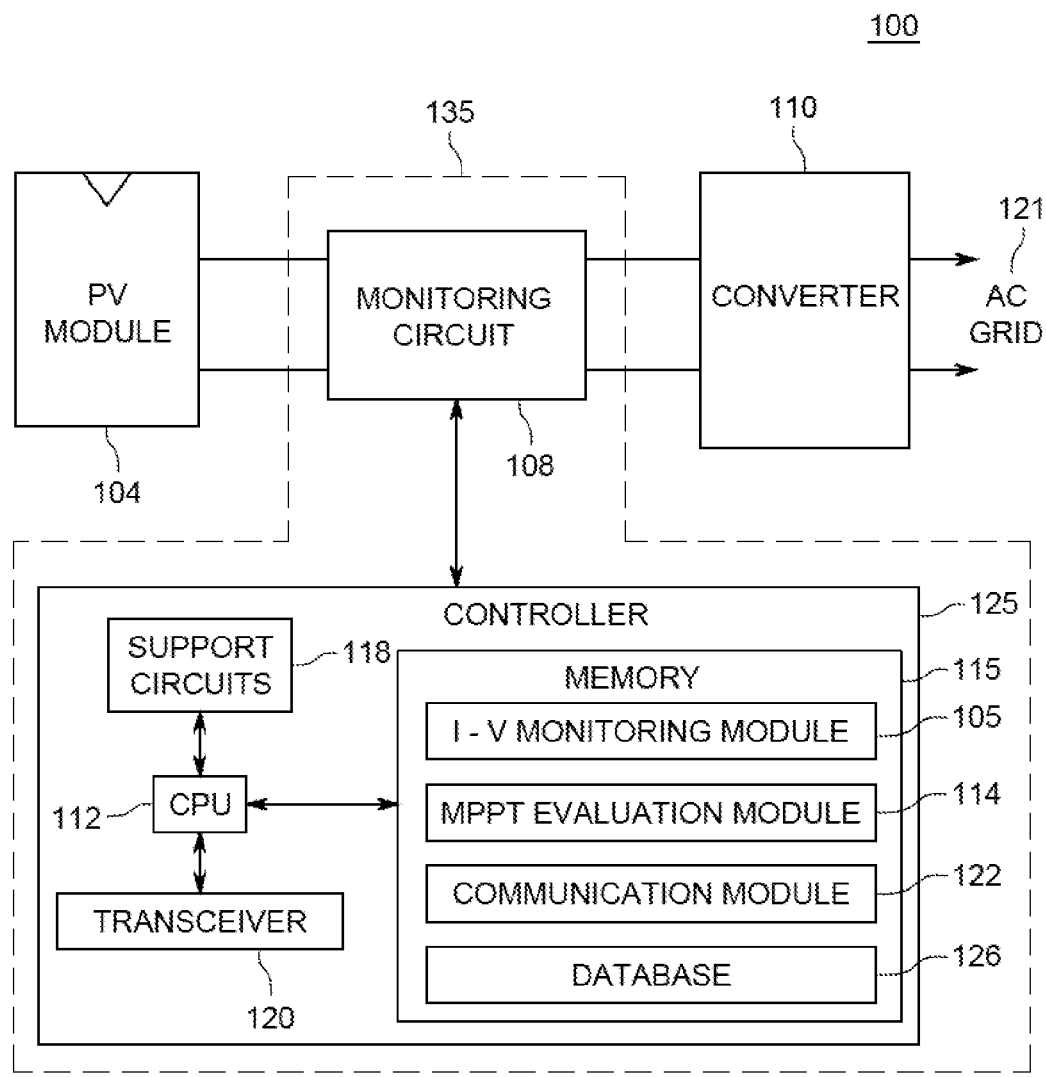
FIG. 1 is a block diagram of a power generator system including a MPPT monitoring system in accordance with one or more embodiments of the present invention.

FIG. 1 is a block diagram of a power generator system 100 including an MPPT monitoring system 135 in accordance with one or more embodiments of the present invention. The MPPT monitoring system 135 comprises a monitoring circuit 108 coupled to a controller 125. In other embodiments, the monitoring circuit is coupled between a plurality of PV modules and a single power converter.

The exemplary power generator system 100 comprises the MPPT monitoring system 135 coupled between a PV module 104, and a converter 110 that employs a MPPT technique. The PV module 104 generates DC current and voltage that is monitored by the monitoring circuit 108. In some embodiments, the converter 110 is a power converter that converts DC power into AC power for a coupled AC grid 121. In some embodiments, the converter 110 is a DC-AC inverter, and in other embodiments, a DC-DC converter. In additional embodiments, the converter 110 is any device employing an MPPT technique for operating the PV module at its MPP.

As will be described in further detail below, the monitoring circuit 108, includes an AC injection circuit that provides a stimulus to determine the dynamic resistance of the PV module 104 and response performance of the MPPT function of the converter 110. In some embodiments, the AC injection circuit is controlled by the controller 125 and results are sampled and communicated by the monitoring circuit 108 to the controller 125 for processing.

The controller 125 includes a central processing unit (CPU) 112, a memory 115, various support circuits 118, and a transceiver 120. The CPU 112 may include one or more microprocessors known in the art, and/or dedicated function processors such as field programmable gate arrays programmed to perform dedicated processing functions. The CPU 112 is coupled to the memory 115, support circuits 118, and the transceiver 120. The support circuits 118 for the CPU 112 may include microcontrollers, application specific integrated circuits (ASIC), cache, power supplies, clock circuits, data registers, input/output (I/O) interface, and the like. In some embodiments, the controller 125 may also be coupled to a display and/or speaker for generating a visual and/or audio indication, such as an alarm indicating when the MPPT efficiency is below a certain level.

The transceiver 120 comprises network communication hardware for communicating the results of the MPPT evaluation module 114 to another device, such as, a gateway (not shown). The transceiver 120 may include an antenna for wireless communications, a network port for wired communications, power line communications (PLC), and the like.

The memory 115 stores non-transient processor-executable instructions and/or data that may be executed by and/or used by the CPU 112. These processor-executable instructions may comprise firmware, software, and the like, or some combination thereof. Modules having processor-executable instructions that are stored in the memory 115 comprise an I-V monitoring module 105, an MPPT evaluation module 114, a communication module 122, and a database 126.

In an exemplary embodiment, the memory 115 may include one or more of the following: random access memory, read only memory, magneto-resistive read/write memory, optical read/write memory, cache memory, magnetic read/write memory, and the like, as well as signal-bearing media, not including non-transitory signals such as carrier waves and the like. The controller 125 may be implemented using a general purpose computer that, when executing particular software, becomes a specific-purpose computer for performing various embodiments of the present invention.

The I-V monitoring module 105 receives and processes measurement data of voltage and current from the monitoring circuit 108. In some embodiments, the data may be analog signals converted into digital data by the controller 125. In other embodiments, the monitoring circuit 108 includes an analog-to-digital circuit and data may be received as digital data. The I-V monitoring module 105 determines when a steady-state voltage and current is present (i.e., stable) from the PV module 104 and accordingly samples and stores associated data. The I-V monitoring module 105 samples at a predetermined rate the measurement data. In addition, the I-V monitoring module 105 is communicatively coupled to the MPPT evaluation module 114 and samples voltage and current during and after an AC stimulus. In some embodiments, the I-V monitoring module 105 stores data in the database 126.

The MPPT evaluation module 114 determines the dynamic resistance dV/dI based on the response from an injection of either an AC voltage or AC current. In some embodiments, the MPPT evaluation module 114 may also control the type of AC stimulus. Next, the MPPT evaluation module 114 compares the dynamic resistance dV/dI and the steady-state V/I to determine whether the PV module 104 is operating above, below, or at its MPP, or even if there is an MPPT function operating in the power converter 110. The AC stimulus causes a change (i.e., response) in output voltage and current from the PV module 104. The change is a compensation triggered by the MPPT function in the converter 110 that is to regulate the PV module 104 at the maximum power point, and is used to determine dV/dI as described further below. In some embodiments, if there is no change (i.e., dV=0 or dI=0), after the AC stimulus, the MPPT function of the converter 110 is not operating.

To determine whether the MPPT function in the converter 110 is compensating for the AC stimulus, voltage and current data are sampled from the monitoring circuit 108 after injection. The corresponding voltage and current changes (dV and dI data) forms a constellation from which dV/dI can be determined as described further below.

If the PV module 104 is not operating at its MPP, for example if the PV module is above or below its MPP by a certain amount, the MPPT evaluation module 114 generates a notification signal through the communication module 122 that the MPPT function of the converter 110 is not operating properly. The notification signal may be a visual indication, audio indication, and a message may be sent to another device such as a gateway communicatively coupled via a wireless, wired, or PLC technique.

The MPPT evaluation module 114 controls the injection of the AC stimulus to "exercise" (i.e., follow) a portion of the I-V curve for determining dV/dI. In some embodiments, an inherent ripple voltage or ripple current of the converter 110 may be used to determine dV/dI. In such embodiments, the MPPT evaluation module 114 does not inject an AC current or AC voltage but rather relies on the variable ripple voltage or current to obtain dV and dI data to determine the dynamic resistance.

The communication module 122 includes instructions for encoding and decoding data to and from the transceiver 120. Communication of data may be via PLC, wired network connections, and wireless networks. In some embodiments, communications may be directed to a gateway (not shown) coupled to the Internet. The gateway provides remote monitoring capability of the performance of the PV module 104 and converter 110.

The database 126 stores recorded monitoring current and voltage data measured by the monitoring circuit 108. In some embodiments, the database 126 may also store user profiles of the system 100 including the type or number of PV modules 104, and types of converter 110 in the system 100. The user profile data may include past operational history such as DC power generated, quantity of PV modules, coupling mechanism (parallel or serial), installation date, and the like. User profile data may be used to generate a predetermined ideal AC stimulus. In some embodiments, the database 126 includes data specifying where to send communications from the communication modules 122 (e.g., email address, web portals, and the like).

Figure 2:
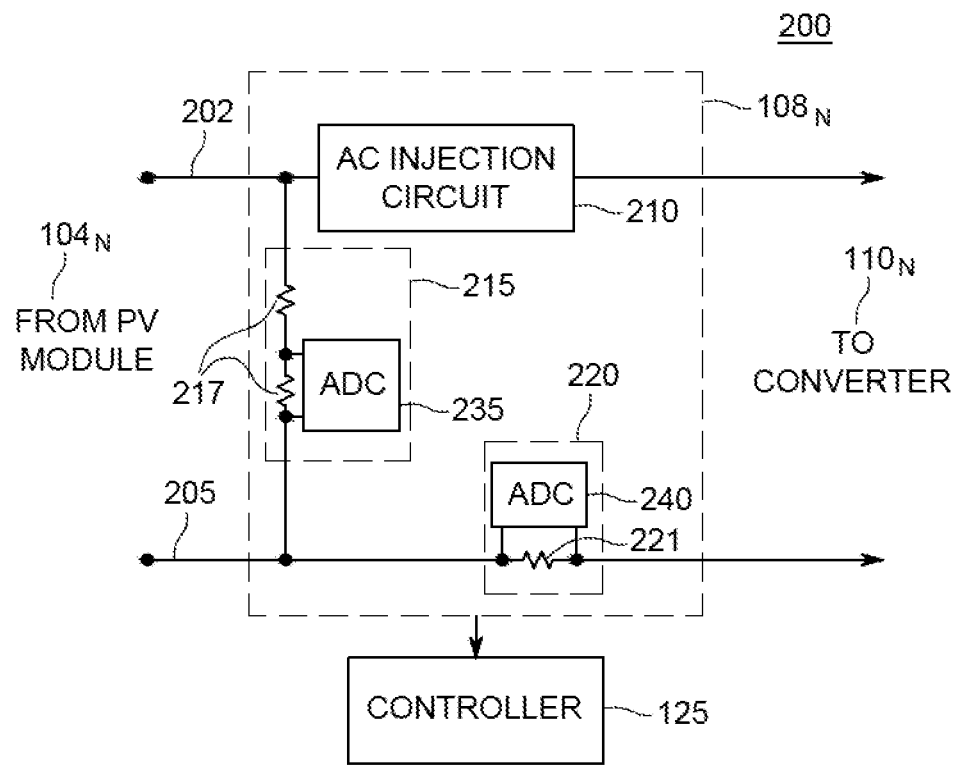
FIG. 2 is a block diagram of a detailed monitoring circuit to monitor MPPT operation in accordance with one or more embodiments of the present invention.

FIG. 2 is a block diagram of the monitoring circuit 108 to monitor MPPT operation in accordance with one or more embodiments of the present invention. The monitoring circuit 108 comprises an AC injection circuit 210, a voltage sampling circuit 215, and a current sampling circuit 220. The voltage sampling circuit 215 and the current sampling circuit 220 perform voltmeter and ammeter functions.

More specifically, the monitor circuit 108 comprises the voltage sampling circuit 215 connected in parallel across two terminals (202 and 205) from the PV module 104. The monitor circuit 108 further comprises the AC injection circuit 210 coupled to the first terminal 202, and a current sampling circuit 220 in series with the second terminal 205. In some embodiments, the AC injection circuit 210 generates an AC current that is coupled to the power converter input as a stimulating signal. The AC current has an amplitude that should be a small fraction compared to that of the current from the PV module 104 (for example, less than 5%). The AC current activates a compensation MPPT function in the converter 110 that subsequently modifies the bias applied to the PV module 104. In other embodiments, a change in voltage is applied (i.e., AC voltage) to cause the MPPT function in the converter 110 to modify the operating point of the PV module 104.

The voltage sampling circuit 215 and the current sampling circuit 220 are respectively capable of actively or passively detecting both AC and DC voltage and current to be processed by the controller 125 and I-V monitoring module 105. The voltage sampling circuit 215 comprises a resistor divider 217 and an analog-to-digital signal converter (ADC) 235 that outputs detected results across the resistor divider 217 to the controller 125. The resistor divider 217 allows a fraction of the overall voltage to be detected as a representation of the output voltage of the PV module 104. The current sampling circuit 220 comprises a resistor 221 and an ADC 240 that outputs detected results across the resistor 221 to the controller 125. In other embodiments, current measurements may be detected using sensors such as hall effect sensors, flux gate sensors, and the like.

Figure 3:
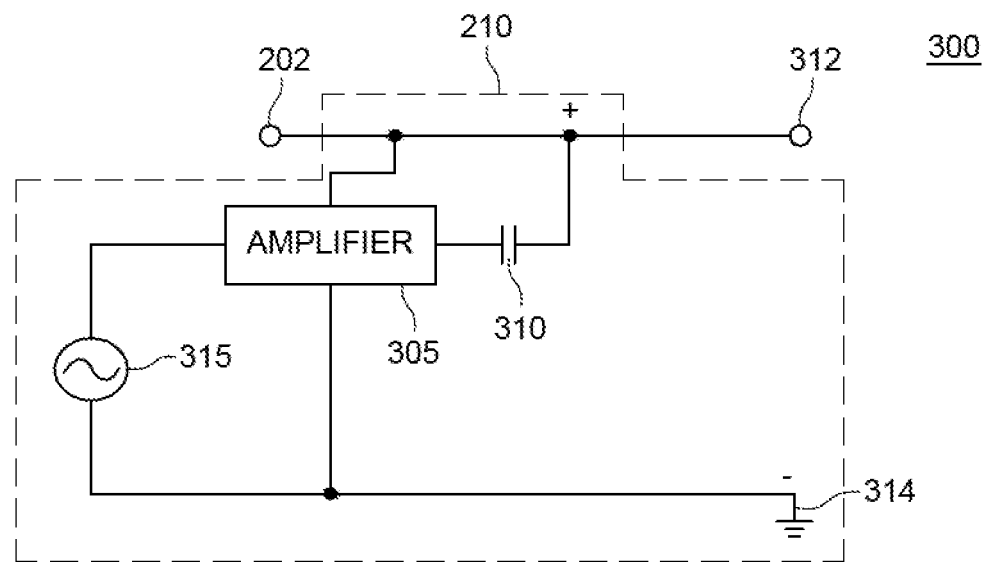
FIG. 3 is a block diagram of an exemplary AC injection circuit in accordance with one or more embodiments of the present invention.

FIG. 3 is a block diagram of an exemplary AC injection circuit for injection circuit 210 in accordance with one or more embodiments of the present invention. Another embodiment of an exemplary injection circuit 210 will be further described below with respect to FIG. 9. FIG. 3 depicts a voltage injection circuit 300 as one embodiment of the injection circuit 210. The voltage injection circuit 300 comprises an amplifier 305, a capacitor 310, and a sine wave generator 315. In some embodiments, the sine wave generator 315 may be a crystal oscillator or a configured operational amplifier outputting a sine wave (i.e., AC signal). In some embodiments, the amplifier 305 is a class AB, B, or D analog amplifier.

The amplifier 305 is coupled to the first terminal 202 that may be of positive bias, and the capacitor 310 which may be a blocking capacitor. The amplifier 305 will inject an AC voltage to the output line 312. The sine wave generator 315 is coupled to the amplifier 205 and node 314. Node 314 in some embodiments represents a ground connection. The AC voltage injection circuit 300 uses power from the PV module 104 to power the amplifier 305 that amplifies the AC signal and couples to the DC line at terminal 202 using the capacitor 310. In some embodiments, the frequency of the AC injected voltage is determined by the controller 125 and in other embodiments may be a predetermined fixed frequency (e.g., 100 Hz to 10 kHz). In general, the excitation of current should not be more than, for example, 1%-10% of nominal power. In some embodiments, the amplitude of the disturbance is adaptive based on the voltage to the power converter 110; i.e., the voltage injection amplitude is a fraction of the measured DC voltage.

Figure 4:
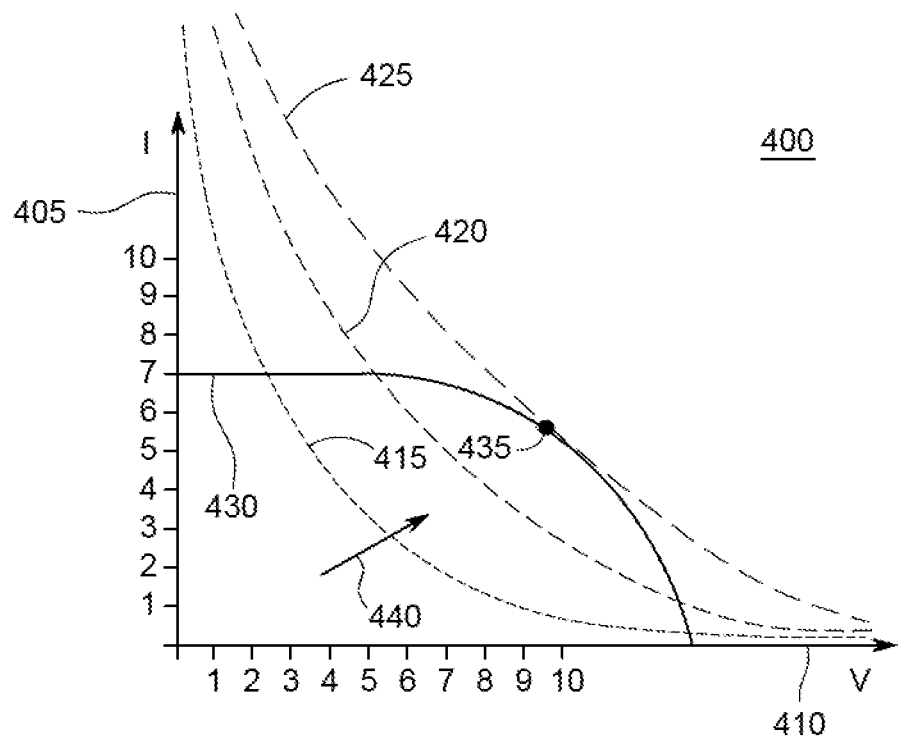
FIG. 4 is an exemplary graph of an I-V curve and constant power curves in accordance with one or more embodiments of the present invention.

FIG. 4 is an exemplary graph 400 of an I-V curve 430 and constant power curves 415, 420, and 425 in accordance with one or more embodiments of the present invention. In the graph 400, the I-V curve 430 is a current-voltage characteristic curve for a PV module such as the PV module 104 and plotted as current 405 versus voltage 410. The point 435 on the I-V curve 430 is the MPP. The constant power curves 415, 420, and 425 represent various amounts of constant power and are increasing in a linear direction 440. The hyperbolic-shaped exemplary constant power curves (415, 420, and 425) are represented by the equation:

$$I = \frac{P}{V} \tag{1}$$

In equation (1), P is a different constant value for each of the constant power curves 415, 420, and 425. The constant power curve 425 and the I-V curve 430 intersect only at the MPP 435. The point 435 represents the MPP and also a location where the slope of both curves (425 and 430) are the same value. The I-V curve 430 of any generator could be difficult to derive, and may vary based on operating conditions or composition defects of the generator. However, the slope of the hyperbolic constant power curve 425 can be determined as:

$$\frac{dV}{dI} = -\frac{P}{I^2} \tag{2}$$

$$= -\frac{V}{I} \tag{3}$$

$$= \frac{V_{MP}}{I_{MP}} \tag{4}$$

at $MPP$

Where $V_{MP}$ and $I_{MP}$ are the voltage and current values, respectively, that correspond to the MPP 435. As such, the relationship between dV/dI and V/I at MPP can be used to determine whether the converter 110 is biasing the PV module 104 at its MPP or not and accordingly notify a user. As will be discussed further below, a comparison of only the amplitudes of dV/dI and V/I determines whether the PV module is operating at the most efficient MPP.

Figure 5:
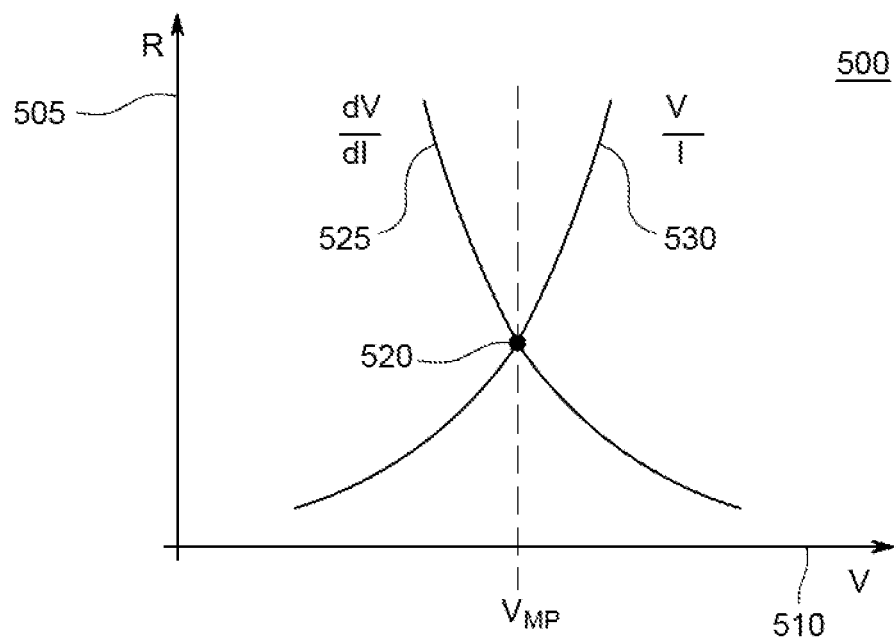
FIG. 5 is a graph of depicting each of dV/dI and V/I as a function of voltage in accordance with one or more embodiments of the present invention.

FIG. 5 is a graph 500 depicting each of dV/dI and V/I as a function of voltage in accordance with one or more embodiments of the present invention. The graph 500 comprises a plot of a dynamic resistance (dV/dI) curve 525 and V/I curve 530. From FIG. 5, the intersection point 520 of the V/I curve 530 versus the dynamic resistance (dV/dI) curve 525 occurs at the maximum power point voltage $V_{MPP}$. As can be seen on the graph 500, by comparing dV/dI to V/I, it can be determined whether the MPPT function of the power converter 110 is operating above, below, or at the MPP. If dV/dI is greater than V/I, the operating voltage is below $V_{MPP}$. If dV/dI is less than V/I, the operating voltage is above $V_{MPP}$. When dV/dI=V/I, the PV module 104 is biased at its maximum power point (i.e., V=$V_{MPP}$ and I=$I_{MPP}$). In some embodiments, only the amplitudes of dV/dI and V/I are compared.

Figure 6:
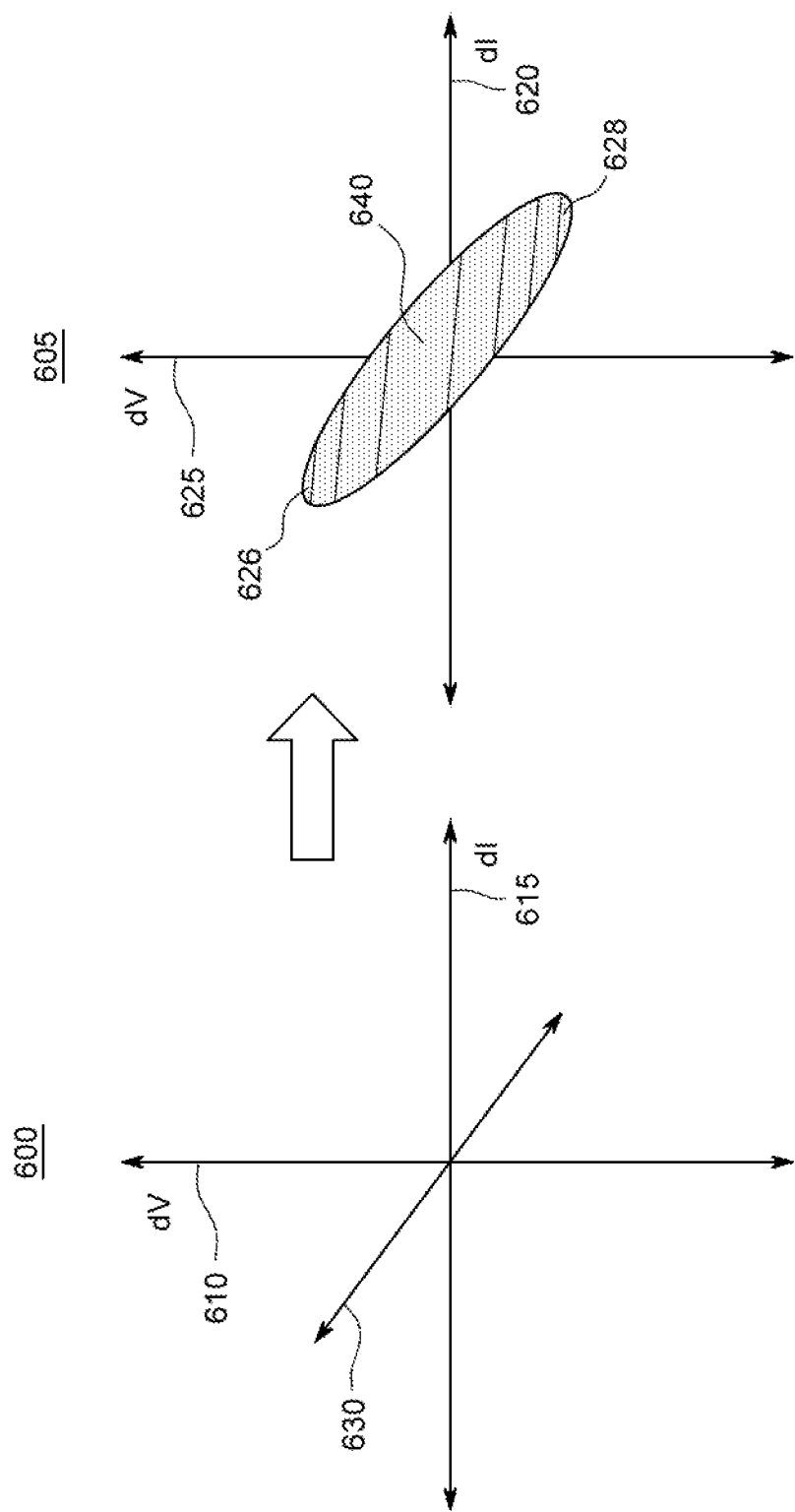
FIG. 6 is a an exemplary comparison of a first graph and a second graph for determining dV/dI in accordance with one or more embodiments of the present invention.

FIG. 6 are exemplary graphs 600 and 605 (i.e., first graph 600 and a second graph 605) for determining dV/dI in accordance with one or more embodiments of the present invention. The description of FIG. 6 is with respect to an embodiment where the AC stimulus discussed above is the ripple from the operation of system 100. However, one of skill in the art would apply a similar method to that of an AC current or voltage stimulus from the MPPT monitoring system 135.

The first graph 600 comprises a constellation of data points shown as an exemplary ripple curve 630 (i.e., stimulus response curve) plotted along current change, dI 610 versus voltage change, dV 615 at lower frequencies such as 30 Hz. The second graph 605 comprises an exemplary second measured ripple constellation area 640 along current change dI 625 versus voltage change dV 620 at higher frequencies such as 1 kHz. The second graph 605 depicts when the ripple voltage has too high of a frequency content, the dV/dI curve opens up from the curve 630 into a constellation of points forming an ellipse (shown collectively as area 640). The opening of the curve 630 to constellation area 640 is likely due to parasitic capacitance in the system 100, i.e., if capacitance is present in parallel with the system such as in the converter 110, the capacitance results in the curve 630 opening up into an ellipse as depicted by the constellation area 640.

For either the curve 630, or the constellation area 640, it is possible to measure an average line using curve fitting to determine dV/dI. In some embodiments, the major axis extremum 626 and 628 of the constellation area 640 may be used to determine a line for obtaining dV/dI. In other embodiments, the curve fitting may follow the paraboloid equation:

$$dv = -a\, dI + b\, dI^2 \quad (6)$$

Equation (6) allows measurement of the slope at the maximum power point and contains variable "a" that represents the slope value to determine whether the PV module 104 is operating above, below, or at the maximum power point. The variable "b" provides information on the curvature (e.g., the curvature of curve 630) and can be used to measure the "sharpness" of the I-V curve and can be used to determine energy loss. For a very sharp curve, operating off the MPP results in a very large impact to efficiency. Thus, curvature information may be used to determine the sharpness of the I-V curve knee and how far the system 100 is currently operating away from the MPP and performance of the MPPT function in the converter 110.

Figure 7:
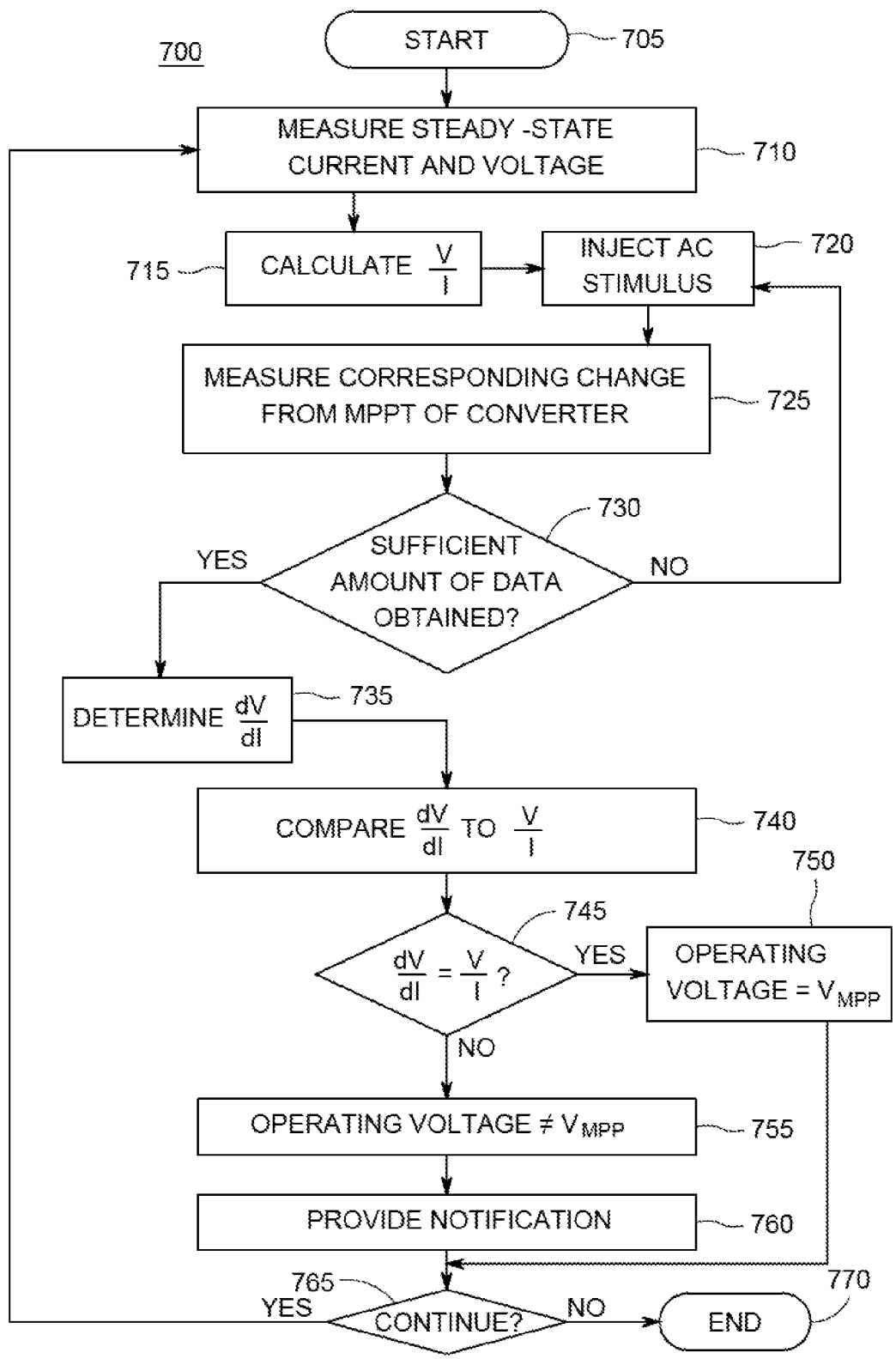
FIG. 7 is a flow diagram illustrating the process steps to determine whether a particular generator is operating at MPP in accordance with one or more embodiments of the present invention.

FIG. 7 is a flow diagram illustrating a method 700 with steps to determine whether a particular generator (e.g., PV module 104) is operating at MPP in accordance with one or more embodiments of the present invention. The method 700 implements the MPPT monitoring system 135 in the system 100. In some other embodiments, the MPPT monitoring system 135 may be employed for monitoring MPP functionality of another type of power converter, such as a DC/DC power converter, or a separate device that performs MPPT functions for a power converter. Certain embodiments may have a different type of DC power source that can be operated at a maximum power point analogous to a PV module. The method 700 begins with step 705 and continues to step 710.

At step 710, steady-state current and voltage from the generator are measured by the monitoring circuit 108. At step 715, a ratio of the steady-state voltage to the steady-state current, V/I is calculated based on the measurements from monitoring circuit 108.

At step 720, an AC stimulus is injected between the PV module 104 and power converter 110 in order to exercise a portion of the I-V curve of the PV module 104. As described above, the AC stimulus may vary in voltage or current. In some alternative embodiments, an inherent ripple voltage or current of the power converter 100 provides the desired operating point movement along the I-V curve and no stimulus injection is needed.

At step 725, a response of the AC stimulus (or the inherent ripple) on system 100 is measured to obtain corresponding changes in voltage bias across and current draw on the PV module 104 by the converter 110. As will be described further below, the measured data may be plotted using a curve-fitting function or coordinates may be calculated using a predetermined formula.

At step 730, the method 700 determines whether the data points are sufficient to perform a curve-fitting function. If the method 700 determines the data points are either insufficient in number, the method 700 returns to step 720 for another AC injection. If however, the method 700 determines the data points are sufficient, the method proceeds to step 740. Alternative curve generation methods may be used to form a curve from the data points.

At step 735, dynamic resistance dV/dI is determined using the measured data from step 725. The dynamic resistance dV/dI may be determined as previously described with respect to FIG. 6. At step 740, the dynamic resistance dV/dI is compared to the computed ratio V/I in amplitude only. As described above, dV/dI and V/I have opposite signs.

At step 745, the method 700 determines whether the values of dV/dI and V/I are equal. If the values are equal, the method 700 proceeds to step 750 where a determination is made that the operating voltage of the PV module 104 is efficiently biased at the maximum power point voltage $V_{MPP}$ and the method 700 proceeds to step 765. If however, at step 745, the method 700 determines the values are unequal, the method 700 proceeds to step 755.

At step 755, a determination is made that the operating voltage is not at the maximum power point voltage $V_{MPP}$. If the amplitude of dV/dI is greater than the amplitude of V/I, the operating voltage is below $V_{MPP}$; if dV/dI is less than V/I, the operating voltage is above $V_{MPP}$.

At step 760, a notification is generated indicating the system 100 is not operating at the MPP, such as a visual or audible alarm. In some embodiments, the notification is sent to an additional device such as a gateway. In some embodiments, the method 700 provides a notification whenever dV/dI and V/I are unequal, or in other embodiments when the amplitudes of dV/dI and V/I differ by a threshold amount. In some embodiments, data regarding operation at MPP may be provided to the power converter 110. In some embodiments it could also provide a notification that the system is operating at MPP.

Figure 8:
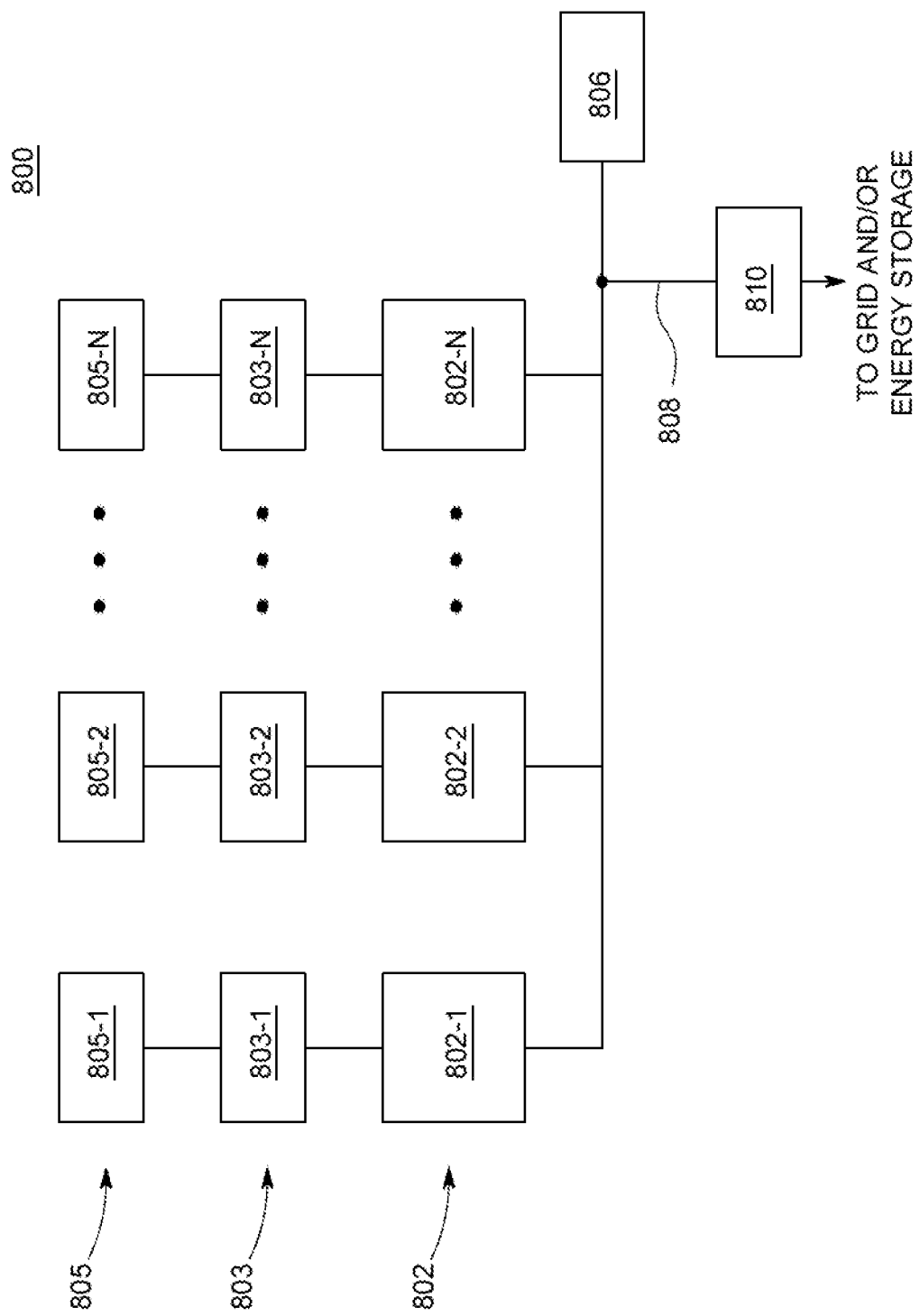
FIG. 8 is a block diagram of a MPPT monitoring system comprising one or more embodiments of the present invention.

FIG. 8 is a block diagram of an MPPT monitoring system 800 comprising one or more embodiments of the present invention. This diagram only portrays one variation of the myriad of possible system configurations and devices that may utilize the present invention. The present invention can be utilized in any system or device that employs maximum power point tracking for operating a power source at its maximum power point.

The system 800 comprises a plurality of power converters 802-1, 802-2 . . . 802-N, collectively referred to as power converters 802, a plurality of MPPT monitoring circuits 803-1, 803-2, . . . 803-N, collectively referred to as MPPT monitoring circuits 803; a plurality of distributed generators 805-1, 805-2 . . . 805-N, are collectively referred to as distributed generators 805; a system controller 806; a bus 808; and a load center 810. Distributed generators 805 may be any suitable generator that can be operated at a maximum power point such as photovoltaic, wind turbines, or other DC sources.

Each power converter 802-1, 802-2 . . . 802-N is coupled to a single distributed generator or group of distributed generators 805-1, 805-2 . . . 805-N, respectively. In some embodiments, each of the power converters 802 correspond to converters 110 as described above in FIG. 1. In some other embodiments, the power converters 802 may be DC-DC converters. Each of the MPPT monitoring circuits 803 correspond to the MPPT monitoring system 135 and distributed generators 805 correspond to PV modules 104 in the above FIG. 1.

The power converters 802 are coupled to the system controller 806 via the bus 808. In some embodiments the MPPT monitoring circuits 803 are coupled to the system controller 806 via the bus 808 for communicating with the system controller 806. The system controller 806 is capable of communicating with the power converters 802 by wireless and/or wired communication (e.g., power line communications) for providing operative control of the power converters 802. The power converters 802 are further coupled to the load center 810 via the bus 808. In some embodiments, the MPPT monitoring circuits 803 are coupled to a gateway (e.g., the system controller 806) for external communications from the system 800 via PLC, wired, or wireless networks (not shown).

In some embodiments where the power converter 802 are DC-AC inverters, the power converters 802 are each capable of converting the received DC power to AC output. The power converters 802 couple the generated AC output power to the grid or energy storage via the bus 808. The generated power may then be distributed for use, for example to one or more appliances, and/or the generated energy may be stored for later use, for example using batteries, heated water, hydro pumping, $H_2O$-to-hydrogen conversion, or the like. In some alternative embodiments, the power converters 802 may be DC-DC power converters and the bus 808 is a DC bus.

In the system 800, each of the MPPT monitoring circuits 803 monitor performance of an MPPT function performed by a respective corresponding power converter 802 as previously described. The MPPT monitoring circuits 803 may provide a notification as previously described for indicating when the corresponding power converter 802 is not operating the corresponding DG 805 at the maximum power point.

Figure 9:
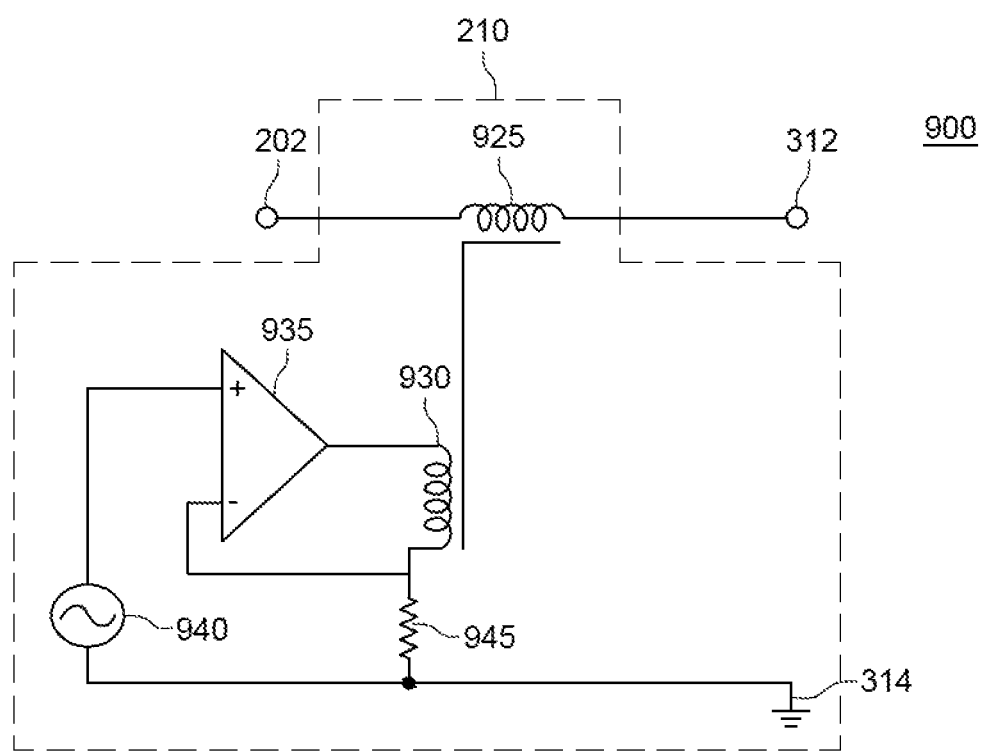
FIG. 9 is a block diagram of an exemplary AC injection circuit in accordance with one or more embodiments of the present invention.

FIG. 9 is a block diagram of a current injection circuit 320 in accordance with one or more embodiments of the present invention. The current injection circuit 900 is one embodiment of the injection circuit 210 and comprises coupled magnetics (925, 930) such as coupled-inductor magnetics, an amplifier 935, a sine wave generator 940, and a resistor 945. In some embodiments, the amplifier 335 is a class AB, or D analog amplifier. In some embodiments, the frequency of the sine wave generator 340 is between 100 Hz to 10 kHz. The amount of current supplied by the AC current injection circuit 320 is directly proportional to the size of the attached system 100 (e.g., 100 mA for a small generation system and 10A for a large generation system). In general, the excitation of current should not be more than, for example, 1%-10% of nominal power. In some embodiments, the amplitude of the disturbance is adaptive based on the current to the power converter 110 (i.e., the current injection amplitude is a fraction of the measured DC current). In some embodiments, the current may be adapted by altering the gain of the amplifier 335, and in other embodiments modifying the sine wave generator 340.

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is defined by the claims that follow.

The invention claimed is:

1. A method for monitoring maximum power point tracking (MPPT) operation comprising:
   measuring, external to a device that performs the MPPT, a DC current and a DC voltage to obtain a DC current value and a DC voltage value, wherein the DC current and the DC voltage are from a distributed generator (DG) coupled to the device;
   determining, external to the device, a constellation of data points, wherein each data point of the constellation comprises a DC voltage change and a corresponding DC current change resulting from an AC waveform;
   determining, external to the device, a dynamic resistance of the DG based on the constellation;
   computing a ratio of the DC voltage value to the DC current value;
   comparing the dynamic resistance to the ratio; and
   determining, based on the comparison of the dynamic resistance to the ratio, if the DG is biased at a maximum power point (MPP).

2. The method of claim 1, wherein the AC waveform is injected between the device and the DG, and is either an AC current or AC voltage.

3. The method of claim 1, wherein the data points are plotted to form the constellation and further comprising generating a response curve from the constellation by applying a curve-fitting function.

4. The method of claim 1, wherein the AC waveform is a power ripple of the device and the DG.

5. The method of claim 1, wherein the dynamic resistance is determined by determining an average line of the constellation.

6. The method of claim 5, wherein the dynamic resistance is the slope of the average line determined by curve-fitting with respect to the constellation.

7. The method of claim 6, wherein the curve-fitting is based on an equation for a parabola.

8. The method of claim 1, further comprising generating a notification upon determining the DG is not operating at the MPP.

9. An apparatus for monitoring maximum power point tracking (MPPT) operation comprising:
   a monitoring circuit, for measuring, external to a device that performs the MPPT, a DC current and a DC voltage to obtain a DC current value and a DC voltage value, wherein the DC current and the DC voltage are from a distributed generator (DG) coupled to the device;
   an AC injection circuit, external to the device, for injecting an AC waveform to generate a constellation of data points wherein each data point of the constellation comprises a DC voltage change and a corresponding DC current change from the injected AC waveform; and a controller operative to determine a dynamic resistance of the DG based on the constellation, compute a ratio of the DC voltage value to the DC current value, compare the dynamic resistance to the ratio, and determine, based on the comparison of the dynamic resistance to the ratio, if the DG is biased at a maximum power point (MPP).

10. The apparatus of claim 9, further comprising a transceiver communicating notification data generated by the controller comprising MPP operation for the device.

11. The apparatus of claim 9, wherein the AC injection circuit further comprises a sine wave generator and injects an AC current.

12. The apparatus of claim 9, wherein the AC injection circuit further comprises a sine wave generator and injects an AC voltage.

13. The apparatus of claim 9, wherein the controller further comprises instructions operative to determine a dynamic resistance from data points from the constellation by applying a curve-fitting function.

14. The apparatus of claim 9, wherein the controller determines the dynamic resistance by determining an average line of the constellation and the dynamic resistance is the slope of the average line determined by curve-fitting with respect to the constellation.

15. A system for monitoring maximum power point tracking (MPPT) operation, comprising:
 at least one photovoltaic (PV) module;
 at least one inverter, coupled to the at least one PV module;
 a MPPT monitor coupled between the at least one PV module and the at least one inverter, wherein the MPPT monitor employs:
  a monitoring circuit, for measuring, external to a device that performs the MPPT, a DC current and a DC voltage to obtain a DC current value and a DC voltage value, wherein the DC current and the DC voltage are from a distributed generator (DG) coupled to the device;
  an AC injection circuit, external to the device, for injecting an AC waveform to generate a constellation of data points wherein each data point of the constellation comprises a DC voltage change and a corresponding DC current change from the injected AC waveform; and
  a controller operative to determine a dynamic resistance of the DG based on the constellation, compute a ratio of the DC voltage value to the DC current value, compare the dynamic resistance to the ratio, and determine, based on the comparison of the dynamic resistance to the ratio, if the DG is biased at a maximum power point (MPP).

16. The system of claim 15, wherein the AC injection circuit further comprises a sine wave generator and injects either an AC current or AC voltage.

17. The system of claim 15, wherein the controller further comprises instructions operative to plot the data points from the constellation by applying a curve-fitting function.

18. The system of claim 15, wherein the AC injection circuit coordinates with the monitoring circuit to interpret a power ripple from the DG and the device as the AC waveform.

19. The system of claim 15, wherein the controller determines the dynamic resistance by determining an average line of the constellation and the dynamic resistance is the slope of the average line determined by curve-fitting with respect to the constellation.

20. The system of claim 15, wherein the transceiver is communicatively coupled to a gateway.

* * * * *